US012492589B2

(12) United States Patent
Kim et al.

(10) Patent No.: US 12,492,589 B2
(45) Date of Patent: Dec. 9, 2025

(54) FIREPROOF DOOR APPARATUS, FIREPROOF STRUCTURE AND SUBSTRATE TREATING FACILITY

(71) Applicant: SEMES CO., LTD., Cheonan-si (KR)

(72) Inventors: Min Beom Kim, Seoul (KR); Eun Sang Yoon, Suwon-si (KR); Nam Ho Chung, Seoul (KR); Doo Hyun Baek, Hwaseong-si (KR)

(73) Assignee: SEMES CO., LTD., Cheonan-si (KR)

( * ) Notice: Subject to any disclaimer, the term of this patent is extended or adjusted under 35 U.S.C. 154(b) by 106 days.

(21) Appl. No.: 18/637,333

(22) Filed: Apr. 16, 2024

(65) Prior Publication Data

US 2024/0392622 A1 Nov. 28, 2024

(30) Foreign Application Priority Data

May 22, 2023 (KR) ........................ 10-2023-0065675

(51) Int. Cl.

| | |
|---|---|
| ***B66B 5/02*** | (2006.01) |
| ***A62C 2/20*** | (2006.01) |
| ***E05F 15/56*** | (2015.01) |
| ***E05F 15/72*** | (2015.01) |
| ***E05F 17/00*** | (2006.01) |
| ***H01L 21/677*** | (2006.01) |

(52) U.S. Cl.

CPC ................ *E05F 15/72* (2015.01); *A62C 2/20* (2013.01); *B66B 5/024* (2013.01); *E05F 15/56* (2015.01); *E05F 17/00* (2013.01); *H01L 21/67712* (2013.01); *H01L 21/6773* (2013.01); *E05F 2017/005* (2013.01); *E05Y 2201/478* (2013.01); *E05Y 2900/134* (2013.01)

(58) Field of Classification Search

CPC .......... E05F 15/72; E05F 1/006; B66B 5/024; A62C 2/06

See application file for complete search history.

(56) References Cited

U.S. PATENT DOCUMENTS

| | | | | |
|---|---|---|---|---|
| 3,877,525 A * | 4/1975 | Husson | E04B 1/941 169/48 |
| 6,342,004 B1 * | 1/2002 | Lattimore | A62C 3/16 169/48 |
| 6,615,544 B1 * | 9/2003 | Tlemcani | E05F 1/006 49/7 |

(Continued)

FOREIGN PATENT DOCUMENTS

| | | |
|---|---|---|
| JP | 2004-270404 | 9/2004 |
| JP | 2004270404 A * | 9/2004 |

(Continued)

*Primary Examiner* — Michael A Riegelman

(74) *Attorney, Agent, or Firm* — WOMBLE BOND DICKINSON (US) LLP

(57) ABSTRACT

Provided are a fireproof door apparatus, a fireproof structure, and a substrate treating facility.

The fireproof door apparatus includes a fireproof shutter opening and closing a passage connecting two spaces, a release unit installed on one side of the passage and in the fireproof shutter and fixing the fireproof shutter in an open state using magnetic force or releasing the fireproof shutter that is fixed, and a gas spring connected to the fireproof shutter and moving the fireproof shutter toward the passage by heat of the fire to close the passage.

20 Claims, 11 Drawing Sheets

(56) References Cited

U.S. PATENT DOCUMENTS

| | | | | |
|---|---|---|---|---|
| 8,844,195 | B2 * | 9/2014 | Cox | A62C 2/14 49/7 |
| 11,154,736 | B2 * | 10/2021 | Reed | A62C 2/18 |
| 12,281,509 | B2 * | 4/2025 | Opgenorth | E05F 1/006 |
| 2018/0305969 | A1 * | 10/2018 | Docksteader | E05F 15/72 |
| 2018/0369623 | A1 * | 12/2018 | Reed | A62C 2/18 |
| 2020/0131824 | A1 * | 4/2020 | Opgenorth | E05F 1/1215 |
| 2020/0173213 | A1 * | 6/2020 | Bucklin | E05B 65/104 |
| 2022/0186554 | A1 * | 6/2022 | Choi | B65G 21/00 |
| 2024/0216724 | A1 * | 7/2024 | Yoon | A62C 2/22 |
| 2024/0392622 | A1 * | 11/2024 | Kim | E05F 15/72 |

FOREIGN PATENT DOCUMENTS

| | | | | |
|---|---|---|---|---|
| KR | 10-2017-0033532 | | 3/2017 | |
| KR | 10-2018-0107099 | | 10/2018 | |
| WO | WO-9624489 | A1 * | 8/1996 | E06B 5/16 |

* cited by examiner

FIREPROOF DOOR APPARATUS, FIREPROOF STRUCTURE AND SUBSTRATE TREATING FACILITY

CROSS-REFERENCE TO RELATED APPLICATIONS

This application claims benefit of priority to Korean Patent Application No. 10-2023-0065675 filed on May 22, 2023 in the Korean Intellectual Property Office, the disclosure of which is incorporated herein by reference in its entirety.

BACKGROUND

1. Field

The present disclosure relates to a fireproof door apparatus opening and closing a passage with a fireproof shutter in the event of a fire, a fireproof structure, and a substrate treating facility.

2. Description of Related Art Disclosure

In general, a production line of a semiconductor or display manufacturing plant, or a substrate treating facility, includes a plurality of stories of clean rooms, and substrate treating apparatuses for performing treating processes, such as deposition, exposure, etching, ion implantation, and cleaning, are arranged in an internal space of each story. A semiconductor device or display device is manufactured by performing a series of treating processes on a substrate in a substrate treating facility.

Meanwhile, transfer of materials between each story, that is, transfer of materials, such as substrates, is performed by a vertical transfer device installed in a vertical direction through each story. The vertical transfer device is disposed through a passage formed between a plurality of stories.

A fireproof door apparatus is installed to close the passage in the event of a fire to prevent the spread of fire between stories. A fireproof shutter of the fireproof door apparatus is fixed with power of an electromagnet (magnetic force) by a release unit on a side outside the passage, thereby opening the passage. However, if power supply to the release unit is not cut off due to a problem in a power signal for the release unit due to a fire, the fireproof shutter may fail to close the passage.

RELATED ART DISCLOSURE DOCUMENT

Patent Document (Patent Document 1) Korean Application Publication No. 10-2017-0033532

SUMMARY

An aspect of the present disclosure is to provide a fireproof door apparatus in which a fireproof shutter is configured to close a passage even when a power signal for a release unit is abnormal in the event of a fire, a fireproof structure, and a substrate treating facility.

According to an aspect of the present disclosure, a fireproof door apparatus includes: a fireproof shutter opening and closing a passage connecting two spaces; a release unit installed on one side of the passage and in the fireproof shutter and fixing the fireproof shutter in an open state using magnetic force or releasing the fireproof shutter that is fixed; and a gas spring connected to the fireproof shutter and moving the fireproof shutter toward the passage by heat of the fire to close the passage.

The gas spring may include: a cylinder installed in a passage frame formed at an edge of the passage and filled with gas; and a piston including a piston head built into the cylinder and a piston rod extending from the piston head toward the passage and connected to the fireproof shutter, wherein the gas in the cylinder expands due to heat of the fire and pushes the piston head to move the piston rod toward the passage.

A guide wheel may be installed on one edge of the fireproof shutter, and a guide rail configured to allow the guide wheel to roll therealong may be installed at one edge of the passage frame.

The passage may be opened and closed by a pair of fireproof shutters movable toward each other, and the release unit and the gas spring may be provided in pairs to correspond to each of the pair of fireproof shutters.

A vertical transfer device may be disposed through the passage, may be disposed between the pair of the fireproof shutters, and may have a hollow formed in a vertical longitudinal direction, and a pair of internal shutters opening and closing the hollow of the vertical transfer device may be installed in portions of the pair of fireproof shutters facing each other.

The vertical transfer device may be a conveyor device having a conveyor frame disposed in a vertical direction, wherein the conveyor frame is disposed around the hollow and has a side hole communicating with the hollow, each of the pair of internal shutters may include: a shutter body installed in a side groove of the fireproof shutter and movable to the hollow through the side hole; and a blocking plate installed to reciprocate on the shutter body, and wherein, when the shutter bodies of the pair of internal shutters facing each other move to a portion of the hollow, the blocking plates of the pair of internal shutters facing each other may be pushed and moved by each other to close the remaining portion of the hollow.

Each of the pair of internal shutters may further include an elastic member installed in the shutter body and connected to the blocking plate so that the blocking plate is returned to its original position in the shutter body after moving to close the remaining portion of the hollow.

Each of the pair of internal shutters may include: a moving block connected to the blocking plate; and an LM guide installed on the shutter body in a moving direction of the blocking plate to guide movement of the blocking plate and having the moving block installed thereon.

Each of the pair of internal shutters may further include a stopper installed in the shutter body and limiting movement of the blocking plate so that the moving block does not fall out of the LM guide.

According to another aspect of the present disclosure, a fireproof structure includes: a plurality of stories, each having a space formed therein; a passage connecting a plurality of spaces of the plurality of stories; and a fireproof door apparatus closing the passage in an event of a fire, wherein the fireproof door apparatus includes: a fireproof shutter opening and closing the passage; a release unit installed on one side of the passage and in the fireproof shutter and fixing the fireproof shutter in an open state using magnetic force or releasing the fireproof shutter that is fixed; and a gas spring connected to the fireproof shutter and moving the fireproof shutter toward the passage by heat of the fire to close the passage.

According to the other aspect of the present disclosure, a substrate treating facility comprising: a fireproof structure including a fireproof door apparatus opening and closing a passage of a plurality of stories; and a vertical transfer device disposed to penetrate through the passage, wherein the fireproof structure includes: the plurality of stories each having a space inside which a substrate treating apparatus is installed; the passage connecting a plurality of spaces of the plurality of stories; and the fireproof door apparatus closing the passage in an event of a fire, wherein the fireproof door apparatus includes: a fireproof shutter opening and closing the passage; a release unit installed on one side of the passage and in the fireproof shutter and fixing the fireproof shutter in an open state using magnetic force or releasing the fireproof shutter that is fixed; and a gas spring connected to the fireproof shutter and moving the fireproof shutter toward the passage by heat of the fire to close the passage.

BRIEF DESCRIPTION OF DRAWINGS

The above and other aspects, features, and advantages of the present disclosure will be more clearly understood from the detailed following description, taken in conjunction with the accompanying drawings, in which.

DETAILED DESCRIPTION

Figure 1:
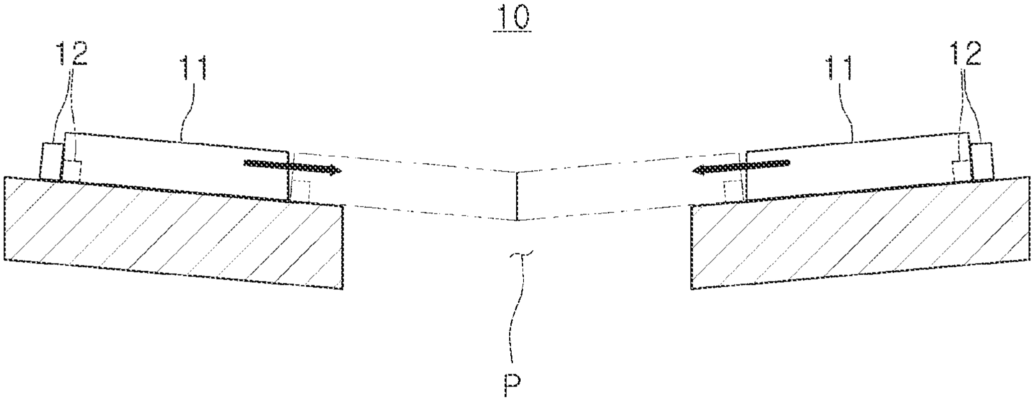
FIG. 1 is a diagram illustrating a fireproof door apparatus according to a related art disclosure.

Hereinafter, embodiments will be described in detail with reference to the accompanying drawings such that they may be easily practiced by those skilled in the art to which the present disclosure pertains. In describing the present disclosure, if a detailed explanation for a related known function or construction is considered to unnecessarily divert the gist of the present disclosure, such explanation will be omitted but would be understood by those skilled in the art. Also, similar reference numerals are used for the similar parts throughout the specification. In this disclosure, terms, such as "above," "upper portion," "upper surface," "below," "lower portion," "lower surface," "lateral surface," and the like, are determined based on the drawings, and in actuality, the terms may be changed according to a direction in which a device or an element is disposed.

It will be understood that when an element is referred to as being "connected to" another element, it may be directly connected to the other element or intervening elements may also be present. In contrast, when an element is referred to as being "directly connected to" another element, no intervening elements are present. In addition, unless explicitly described to the contrary, the word "comprise" and variations, such as "comprises" or "comprising," will be understood to imply the inclusion of stated elements but not the exclusion of any other elements.

Figure 3:
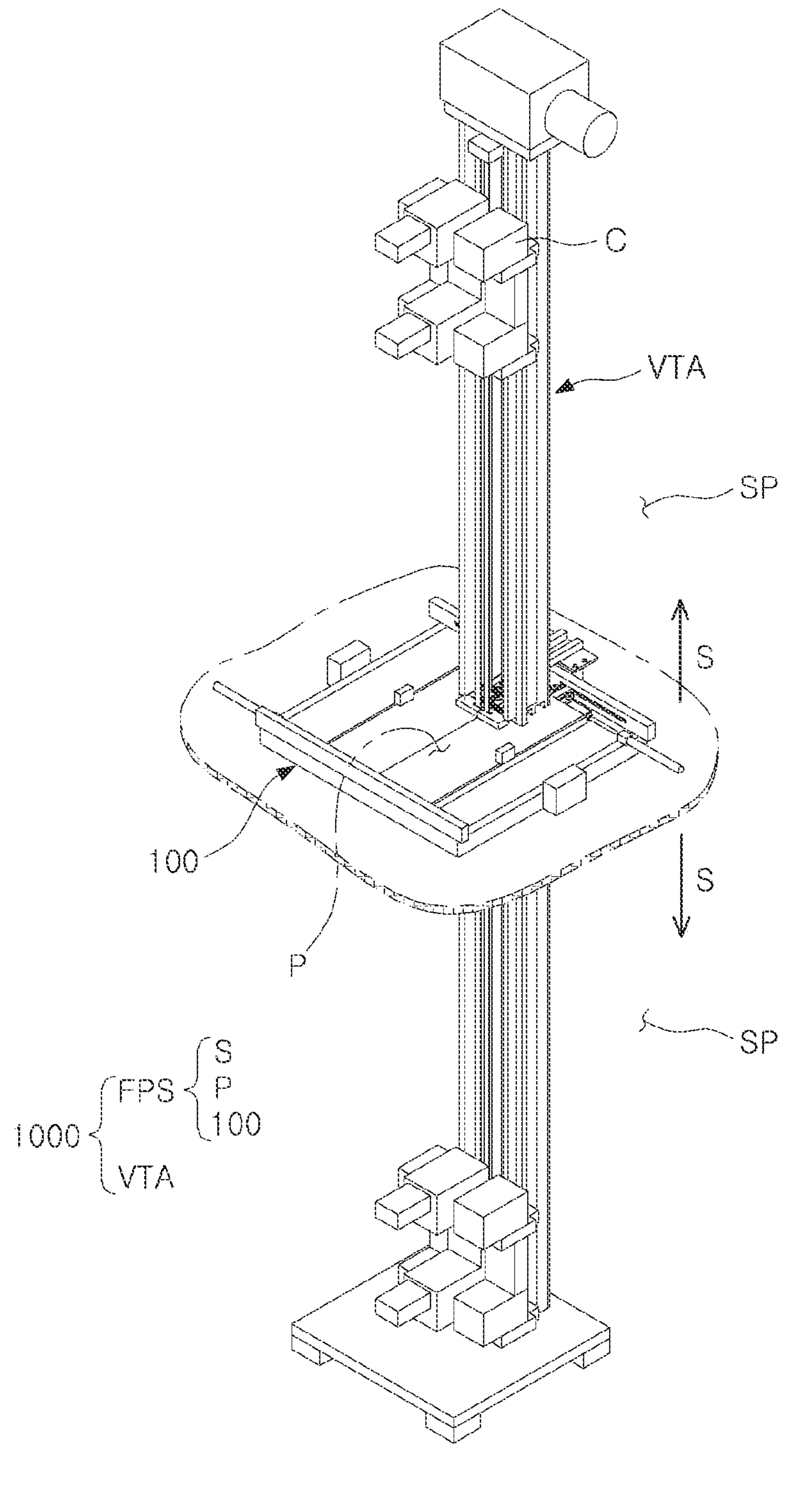
FIG. 3 is a diagram illustrating a substrate treating facility according to an embodiment of the present disclosure.
Figure 4:
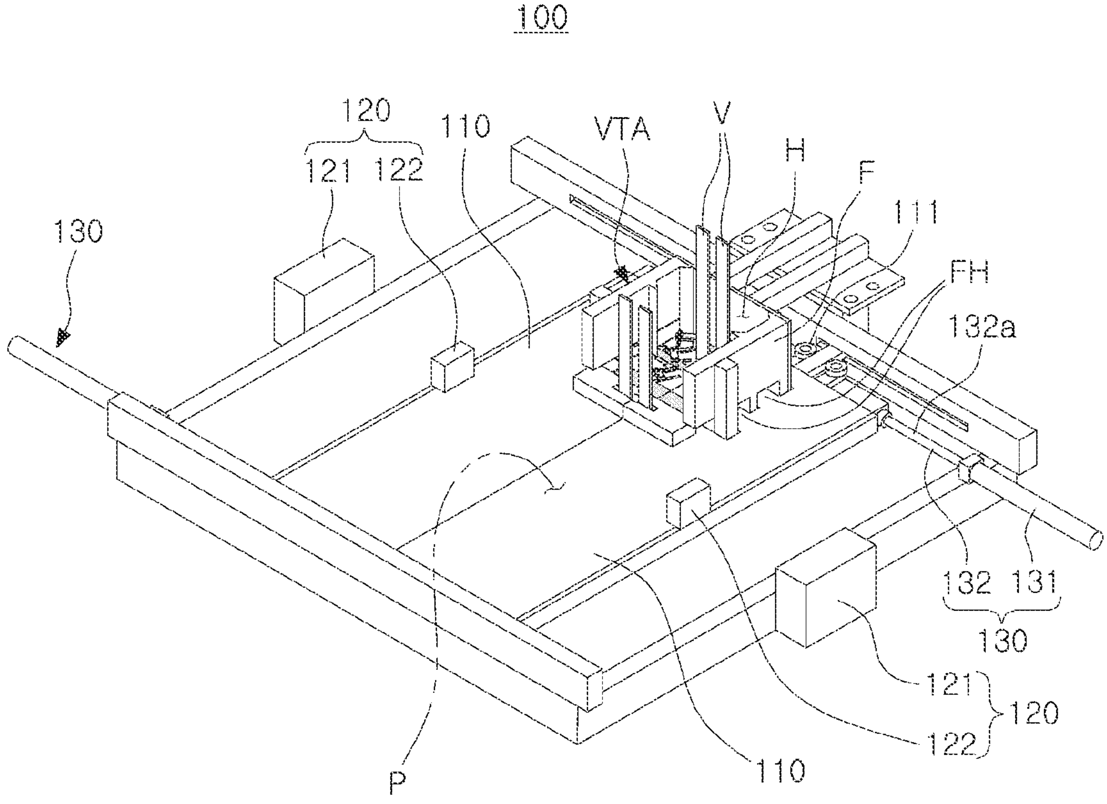
FIG. 4 is a diagram illustrating a fireproof door apparatus in the substrate treating facility of FIG. 3.
Figure 5:
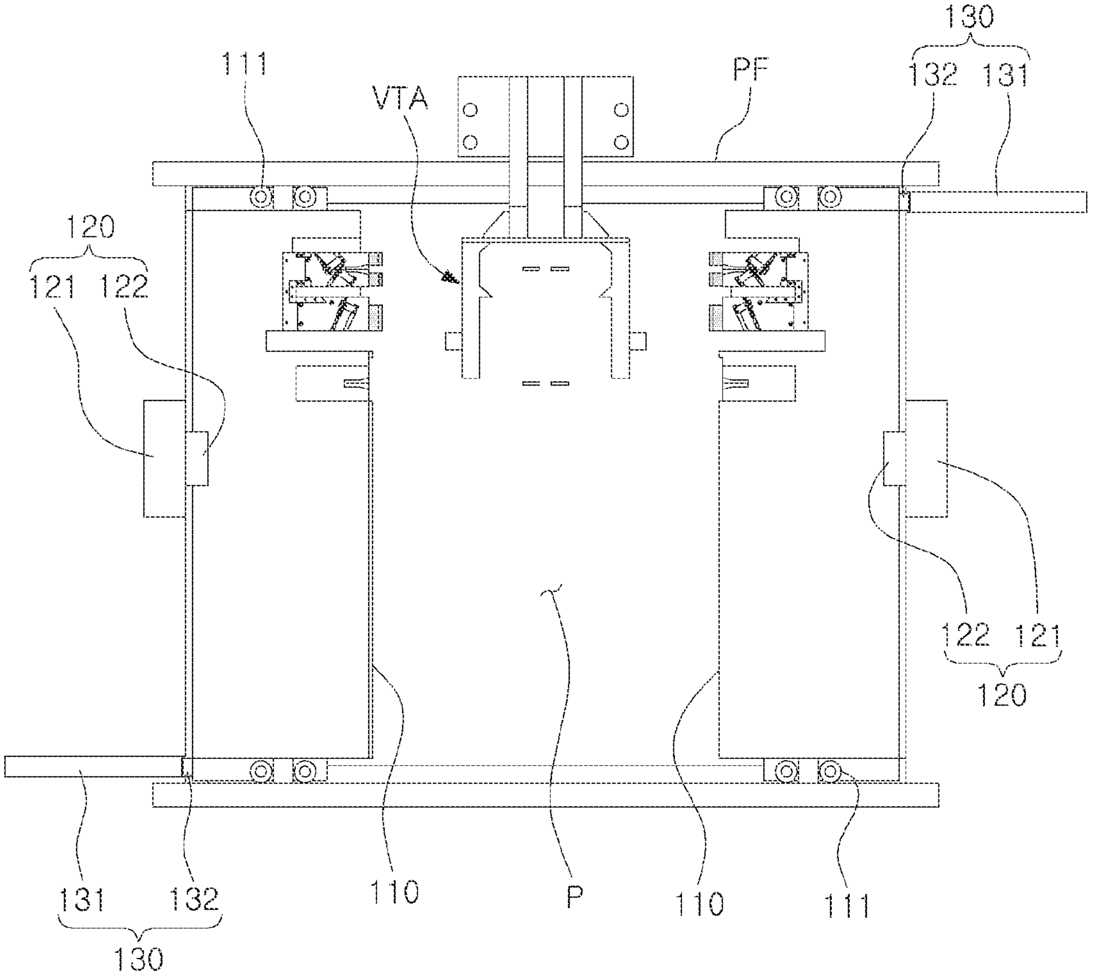
FIG. 5 is a plan view illustrating that a passage is not closed by a fireproof shutter of the fireproof door apparatus of FIG. 4.
Figure 6:
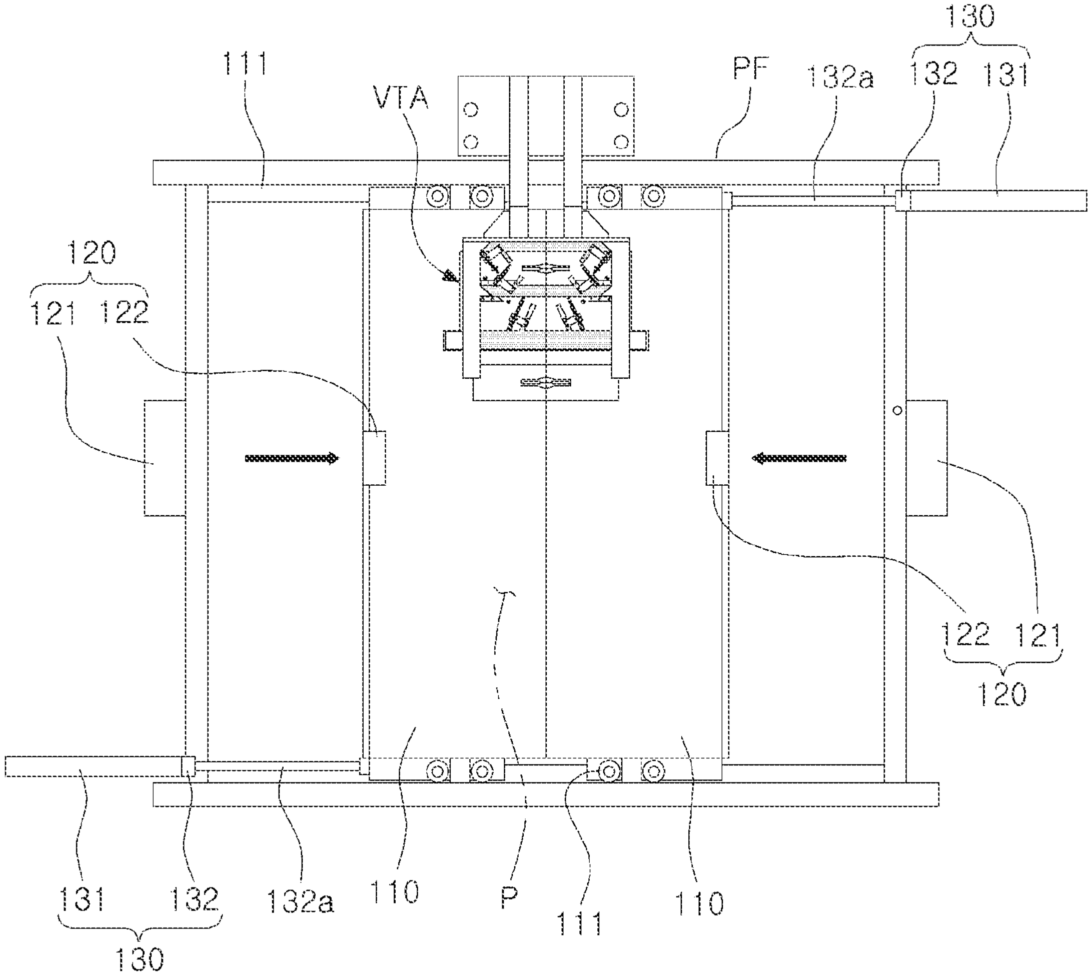
FIG. 6 is a plan view illustrating the fireproof shutter of FIG. 5 closing the passage.

FIG. 3 is a diagram illustrating a substrate treating facility according to an embodiment of the present disclosure, FIG. 4 is a diagram illustrating a fireproof door apparatus in the substrate treating facility of FIG. 3, FIG. 5 is a plan view illustrating that a passage is not closed by a fireproof shutter of the fireproof door apparatus of FIG. 4, and FIG. 6 is a plan view illustrating the fireproof shutter of FIG. 5 closing the passage.

Referring to the drawings, a substrate treating facility 1000 according to an embodiment of the present disclosure includes a fireproof structure FPS and a vertical transfer device VTA. Here, the fireproof structure FPS includes a plurality of stories S, a passage P, and a fireproof door apparatus 100.

Each of the plurality of stories S has a space SP inside which a substrate treating apparatus (not shown) is installed. In this manner, each space SP formed inside each of the plurality of stories S is a clean room, and a substrate treating apparatus for treating substrates is installed therein.

In addition, the passage P is a portion connecting the plurality of spaces SP of the plurality of stories S and is formed between adjacent stories S so that the spaces SP of the adjacent stories S may communicate with each other.

In addition, the fireproof door apparatus 100 is an apparatus closing the passage P in the event of a fire to prevent the fire from spreading to adjacent stories S when a fire occurs on a story S.

The vertical transfer device VTA is disposed through the passage P. As an example, the vertical transfer device VTA may be a conveyor device disposed in a vertical direction. A carriage module C may be fixed to a conveyor belt V of the conveyor device and may include a robot picking up a container, such as a foup in which a substrate is accommodated.

The fireproof door apparatus 100 is described in detail as follows.

The fireproof door apparatus 100 includes a fireproof shutter 110, a release unit 120, and a gas spring 130.

The fireproof shutter 110, a shutter opening and closing the passage P, may be formed of a fire-resistant material or may be surface-treated with a fire-resistant material. A guide wheel 111 may be installed on one edge of the fireproof shutter 110, and a guide rail (not shown) may be installed on one edge of a passage frame FP formed at the edge of the passage P to allow the guide wheel 111 to roll therealong. As this guide wheel 111 moves along the guide rail, the fireproof shutter 110 opens and closes the passage P.

In addition, the release unit 120 is disposed on one side of the passage P and in the fireproof shutter 110 and fix the fireproof shutter 110 in an open state or release the fixed fireproof shutter 110 using magnetic force (force of an electromagnet). The release unit 120 may include a first release member 121 installed in the passage frame PF on one side of the passage P and a second release member 122 installed in the fireproof shutter 110 and magnetically coupled to the first release member 121. Furthermore, a specific structure of the release unit 120 is not limited by the present disclosure, and any release configuration of the related art may be used as long as the release configuration has the function of fixing the fireproof shutter 110 with magnetic force or releasing the fixed fireproof shutter 110.

The gas spring 130 is connected to the fireproof shutter 110 and moves the fireproof shutter 110 toward the passage by heat of a fire P to close the passage P. That is, in order to close the passage P with the fireproof shutter 110 in the event of a fire, the gas spring 130 moves the fireproof shutter 110 toward the passage P, and here, the gas spring 130 is operated by heat of the fire to move the fireproof shutter 110.

In this manner, in the present disclosure, the fireproof shutter 110 is moved toward the passage P by the gas spring 130, whereas, in the related art, the fireproof shutter is moved by an inclined structure or a reel spring.

Specifically, a fireproof door apparatus 10 according to the related art has an inclined structure in which the fireproof shutter 11 is disposed inclined downwardly toward the passage P, as illustrated in FIG. 1. For this reason, when power supply to the release unit 12 is cut off after a fire occurs, the fireproof shutter 11 moves downwardly due to its own weight and closes the passage P.

Figure 2:
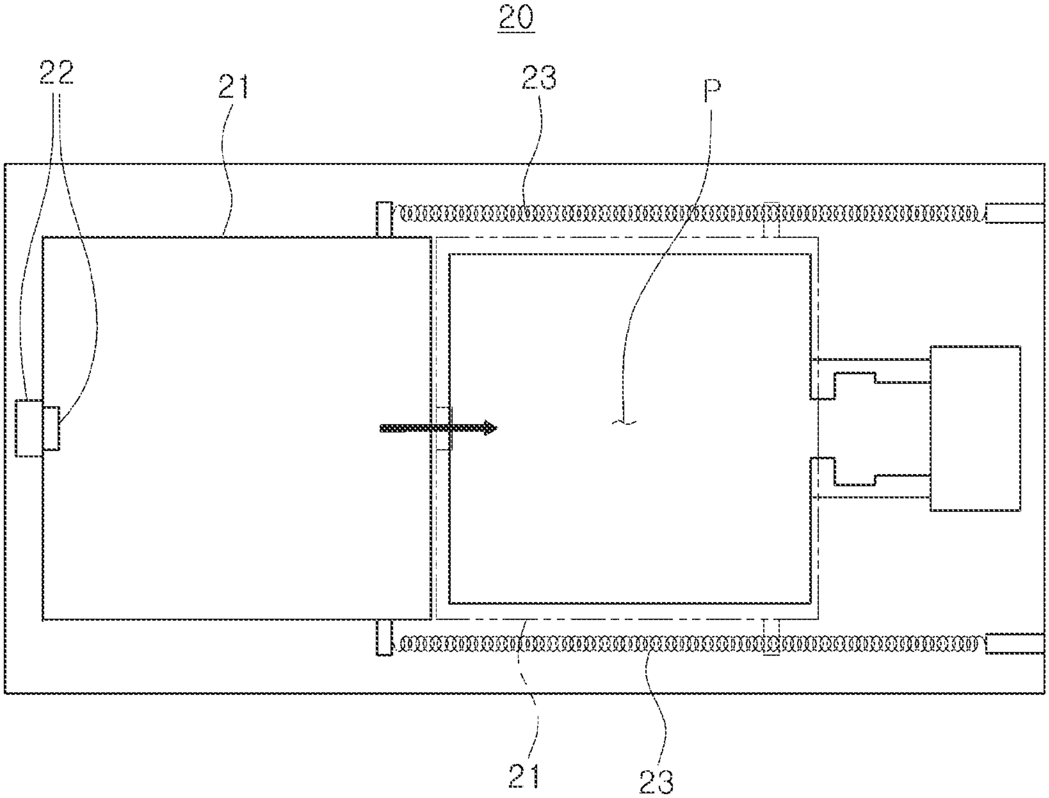
FIG. 2 is a diagram illustrating a fireproof door apparatus according to another related art disclosure.

In addition, a fireproof door apparatus 20 according to another related art disclosure has a structure in which the fireproof shutter 21 is connected to a frame by a reel spring 23, as illustrated in FIG. 2. At this time, the reel spring is installed in a frame portion on the passage P side, so that, when power supply to the release unit 22 is cut off after a fire occurs, the fireproof shutter 21 is pulled by elastic restoring force of the reel spring 23 to close the passage P.

As such, in the related art, the fireproof shutters 11 and 12 are moved to the passage side by an inclined structure or a reel spring 23, and when a fire occurs, the fireproof shutters 11 and 12 be moved only when power supply to the release units 12 and 22 is intentionally cut off.

In this case, if a power signal for the release units 12 and 22 is abnormal due to a fire so power supply is not cut off, the fireproof shutters 11 and 21 cannot move toward the passage P and the passage P cannot be closed.

In order to overcome this problem, in the present disclosure, the fireproof shutter 110 is moved toward the passage P using the gas spring 130. That is, the gas spring 130 closes the passage P by moving the fireproof shutter 110 toward the passage P by heat of the fire. Based on the ideal gas equation, PV=nRT, when the temperature T rises as a fire occurs, the volume of gas inside the gas spring 130 expands explosively. As the strong expansion force overcomes the electromagnet force of the release unit 120, the fireproof shutter 110 is moved toward the passage P.

The gas spring 130 specifically includes a cylinder 131 and a piston 132.

Here, the cylinder 131 is installed in the passage frame PF formed at the edge of the passage P, and the inside of the cylinder is filled with gas.

The piston 132 includes a piston head and a piston rod 132*a*. The piston head is built into the cylinder 131, and the piston rod 132*a* extends from the piston head toward the passage P and is connected to the fireproof shutter 110.

By configuring the gas spring 130 in this manner, when a fire occurs, gas in the cylinder 131 expands by heat of the fire, and the expanded gas pushes the piston head to move the piston rod 132*a* toward the passage P, so that the fireproof shutter 110 is moved toward the passage P. Even if power supply is not cut off due to abnormality of a power signal for the release unit 120 due to a fire, the strong gas expansion force of the gas spring 130 may overcome the electromagnet force of the release unit 120 and the fireproof shutter 110 may be moved toward the passage P.

Meanwhile, the passage P may be opened and closed by a pair of fireproof shutters 110, as described above, that are movable toward each other. At this time, the release unit 120 and the gas spring 130 may be provided in pairs to correspond to each of the pair of fireproof shutters 110. Furthermore, a plurality of gas springs 130 may be installed in a single fireproof shutter 110.

The vertical transfer device VTA disposed to penetrate through the passage P may be disposed between a pair of fireproof shutters 110 and may have a hollow H formed in a vertical and longitudinal direction. Here, the hollow H is a route along which a portion of the carriage module C of the vertical transfer device VTA, which transports containers, such as foups, in the vertical transfer device VTA, and a counterweight (a balance weight) move.

Figure 7:
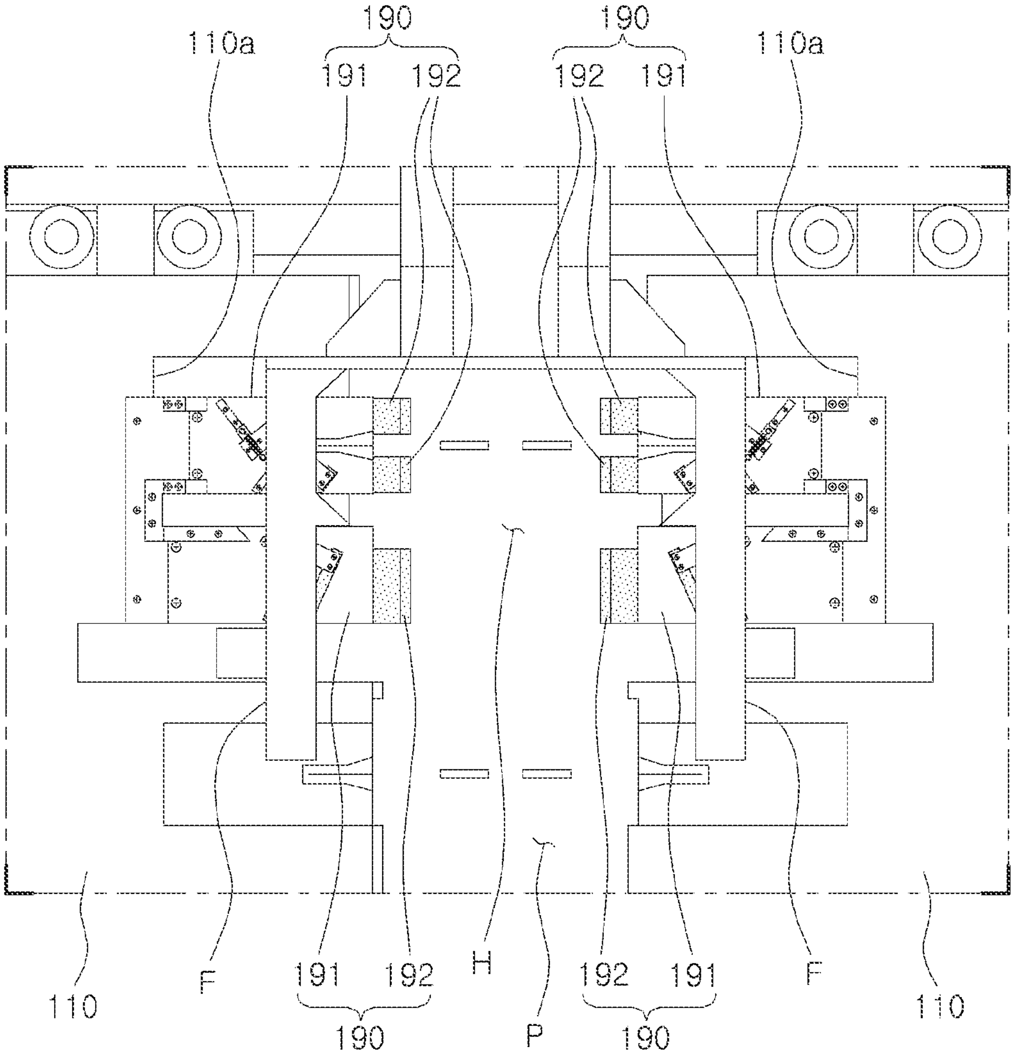
FIGS. 7 to 9 are diagrams illustrating a process in which an internal shutter of the fireproof shutter of FIG. 6 closes a hollow of a vertical transfer device.
Figure 8:
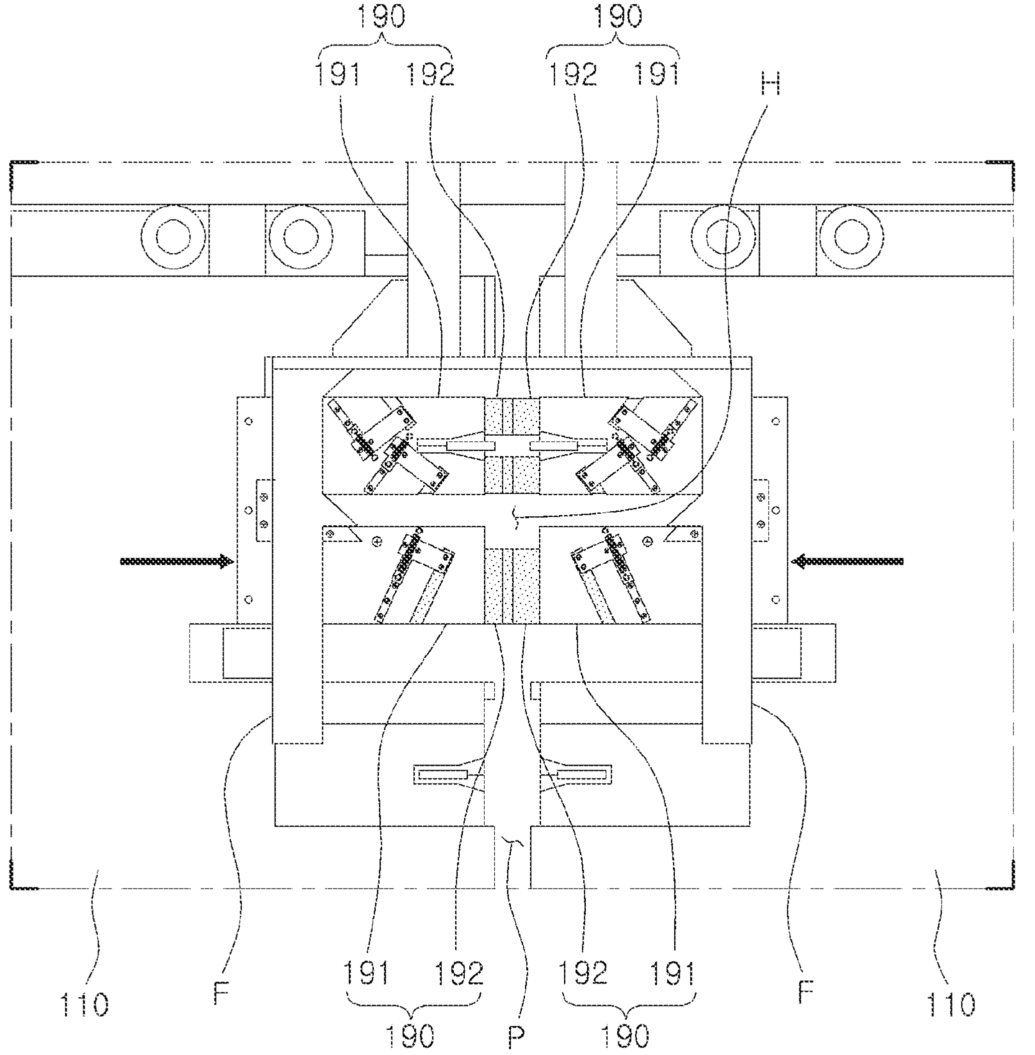
Figure 9:
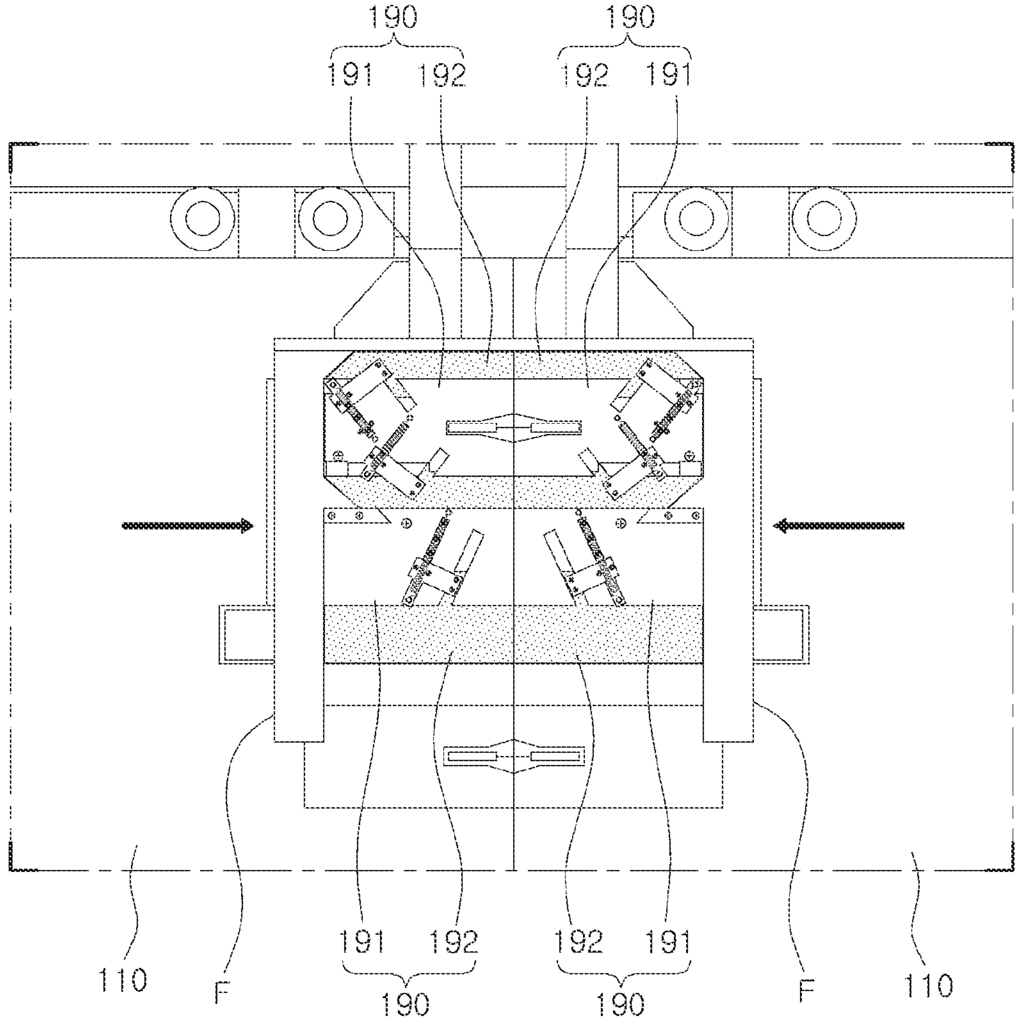
Figure 10:
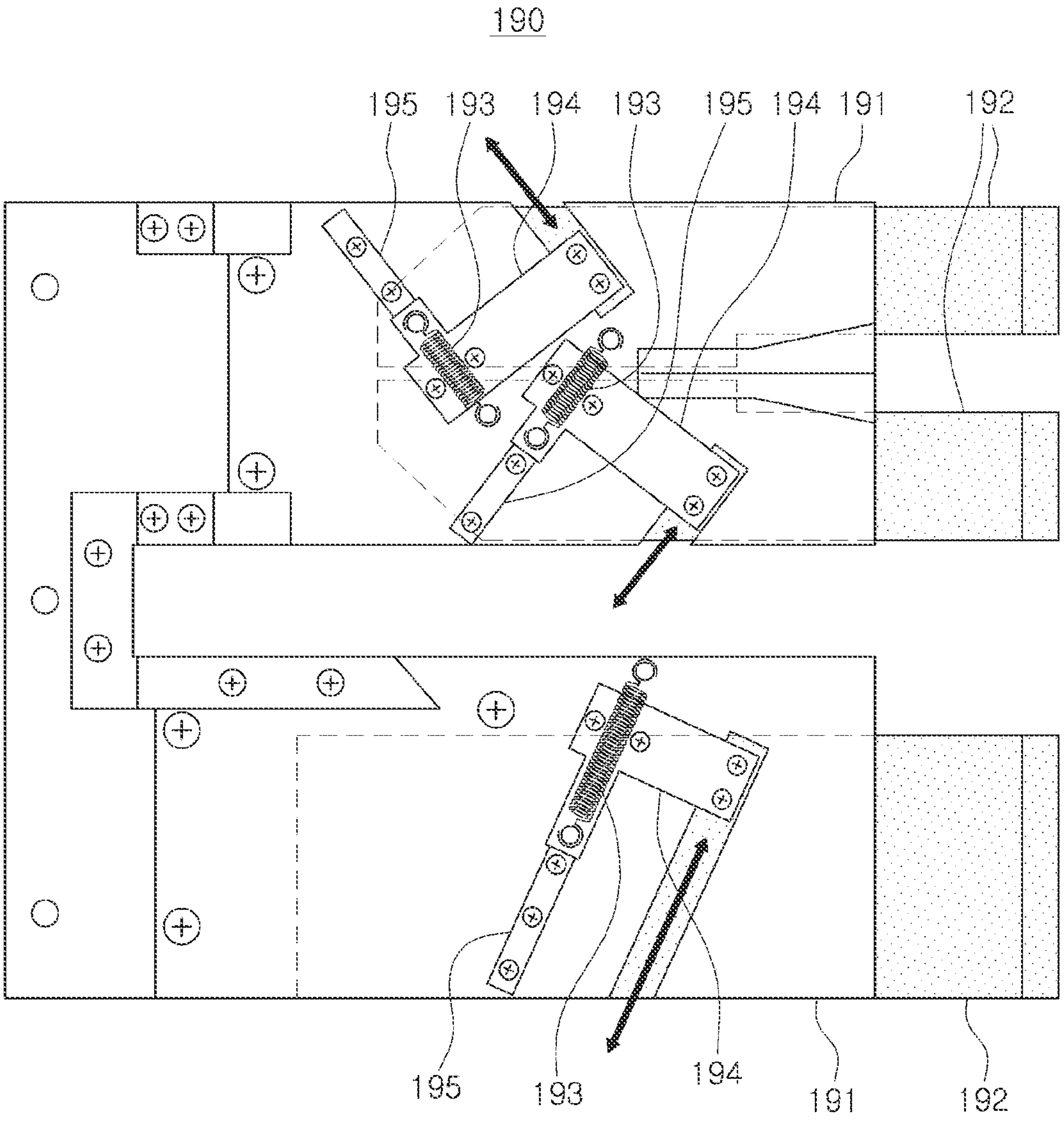
FIG. 10 is a plan view illustrating the internal shutter of FIG. 7.
Figure 11:
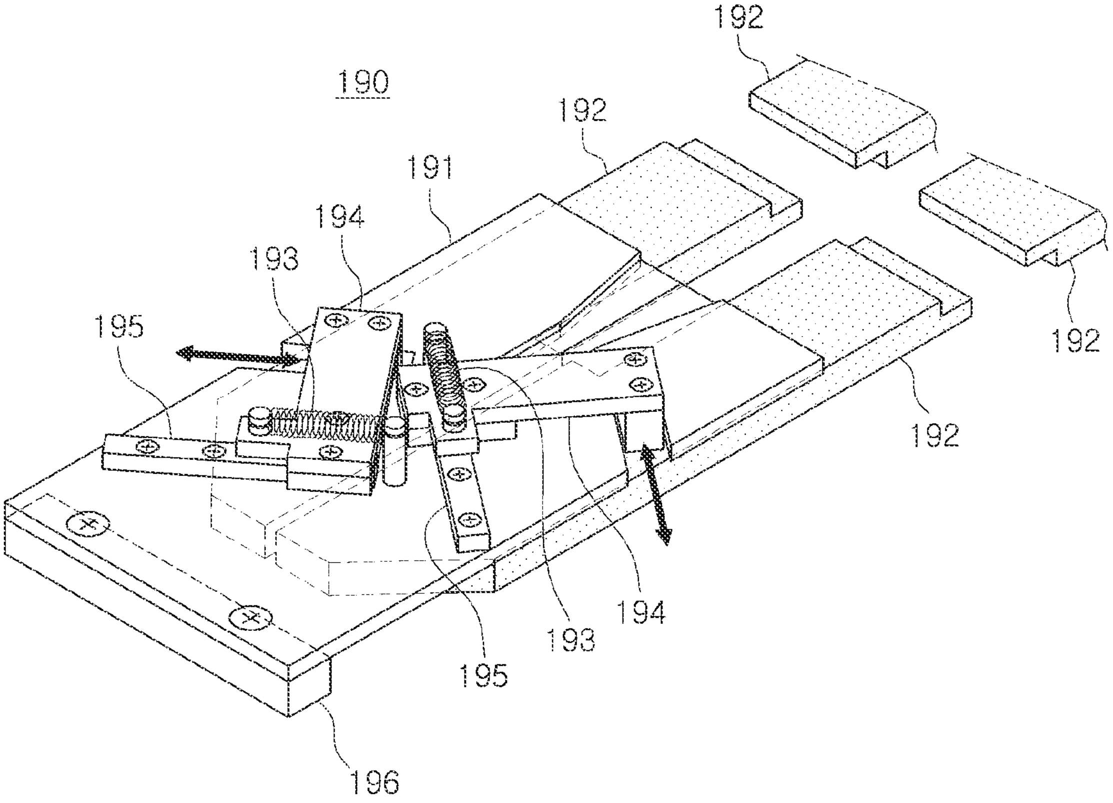
FIGS. 11 and 12 are perspective views illustrating the internal shutter of FIG. 10.
Figure 12:
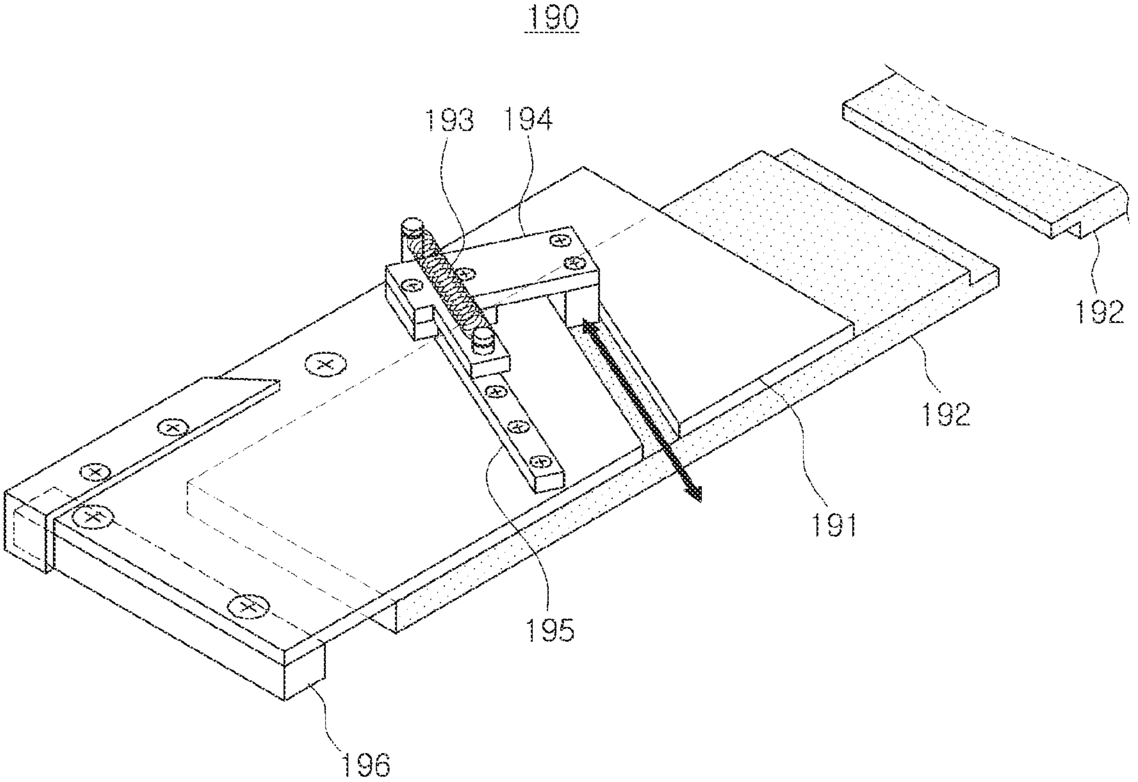

FIGS. 7 to 9 are diagrams illustrating a process in which an internal shutter of the fireproof shutter of FIG. 6 closes the hollow of the vertical transfer device, FIG. 10 is a plan view illustrating the internal shutter of FIG. 7, and FIGS. 11 and 12 are perspective views illustrating the internal shutter of FIG. 10.

Referring to FIGS. 4 and 7 to 12, the vertical transfer device VTA is a conveyor device and may include a conveyor frame F disposed in the vertical direction. The conveyor frame F may be located around the perimeter of the hollow H and may have a side hole FH formed to communicate with the hollow H.

In the present disclosure, a pair of internal shutters 190 opening and closing the hollow H of the vertical transfer device VTA may be installed in portions of the pair of fireproof shutters 110 facing each other.

Specifically, each of the pair of internal shutters 190 may include a shutter body 191 and a blocking plate 192.

The shutter body 191 is installed in a side groove 110*a* of the fireproof shutter 110, and the side groove 110*a* is formed in portions of the pair of fireproof shutters 110 facing each other. The shutter body 191 has a structure movable to the hollow H through the side hole (FH in FIG. 4). That is, when the fireproof shutter 110 moves toward the passage P, the shutter body 191 enters the hollow H through the side hole FH of the conveyor frame F.

In addition, the blocking plate 192 is installed to reciprocate in the shutter body 191.

The internal shutter 190 having the shutter body 191 and the blocking plate 192 may close the hollow H of the vertical transfer device VTA. That is, referring to FIGS. 7 to 9, when the shutter bodies 191 of the pair of internal shutters 190 facing each other move to a portion of the hollow H, the blocking plates 192 of the pair of internal shutters 190 facing each other may be pushed by each other and moved to close the remaining portion of the hollow H. In the blocking plates 192 facing each other, the portions thereof facing each other has a labyrinth structure, rather than a straight structure, thereby reliably blocking the spread of smoke.

Conversely, when the pair of internal shutters 190 move away from each other, the blocking plates 192 facing each other may return to their original positions in the shutter body 191. To this end, each of the pair of internal shutters 190 may further include an elastic member 193. The elastic member 193 is installed in the shutter body 191 and is connected to the blocking plate 192 so that the blocking body 192 is returned to its original position in the shutter body 191 after moving to close the remaining portion of the hollow H. That is, the elastic member 193 pulls the blocking plate 192 to its original position by elastic restoring force.

Furthermore, each of the pair of internal shutters 190 may further include a moving block 194 and an LM guide 195. The moving block 194 is connected to the blocking plate 192. In addition, the LM guide 195 is installed in a direction of movement of the blocking plate 192 in the shutter body 191 to guide the movement of the blocking plate 192, and a moving block 194 is installed therein.

In addition, each of the pair of internal shutters 190 may further include a stopper 196. The stopper 196 is installed in the shutter body and limits the movement of the blocking plate 192 so that the moving block 194 does not fall out of the LM guide 195.

The internal shutter 190 configured as described above is installed in the fireproof shutter 110, so that when the fireproof shutter 110 closes the passage P, the internal shutter 190 may close the hollow H of the vertical transfer device VTA even without a separate driving source.

As a result, since the present disclosure includes the gas spring 130 that operates by expanding gas by heat of a fire, so that the passage P may be reliably closed with the fireproof shutter 110 in the event of a fire. In other words, in the present disclosure, even if power supply to the release unit 120 is not cut off due to an abnormality in a power signal for the release unit 120 due to a fire, the strong gas expansion force of the gas spring 130 overcomes the electromagnet force of the release unit 120 and the fireproof shutter 110 may be moved toward the passage P.

In addition, in the present disclosure, the pair of internal shutters 190 are installed in the pair of fireproof shutters 110 and the pair of internal shutters 190 are provided with the blocking plates 192 that are pushed and moved by each other, and thus, the internal shutter 190 may close the hollow H of the vertical transfer device VTA even without a separate driving source.

In the present disclosure, since the gas spring operated as gas expands by heat of a fire, the passage may be reliably closed with the fireproof shutter in the event of a fire. Specifically, even if power supply to the release unit is not cut off due to an abnormality in a power signal for the release unit due to a fire, the strong gas expansion force of the gas spring of the present disclosure may overcome the electromagnet force of the release unit, thereby moving the fireproof shutter toward the passage.

In addition, in the present disclosure, since the pair of internal shutters are installed in the pair of fireproof shutters and the pair of internal shutters are provided with the blocking plates that are pushed and moved by each other, the internal shutters may close the hollow of the vertical transfer device even without a separate driving source.

While embodiments have been illustrated and described above, it will be apparent to those skilled in the art that modifications and variations could be made without departing from the scope of the present disclosure as defined by the appended claims.

What is claimed is:

1. A fireproof door apparatus comprising:

a fireproof shutter opening and closing a passage connecting two spaces;

a release unit installed on one side of the passage and in the fireproof shutter and fixing the fireproof shutter in an open state using magnetic force or releasing the fireproof shutter that is fixed; and a gas spring connected to the fireproof shutter and moving the fireproof shutter toward the passage by heat of the fire to close the passage.

2. The fireproof door apparatus of claim 1, wherein the gas spring includes:

a cylinder installed in a passage frame formed at an edge of the passage and filled with gas; and a piston including a piston head built into the cylinder and a piston rod extending from the piston head toward the passage and connected to the fireproof shutter, wherein the gas in the cylinder expands due to heat of the fire and pushes the piston head to move the piston rod toward the passage.

3. The fireproof door apparatus of claim 2, wherein a guide wheel is installed on one edge of the fireproof shutter, and a guide rail configured to allow the guide wheel to roll therealong is installed at one edge of the passage frame.

4. The fireproof door apparatus of claim 1, wherein the passage is opened and closed by a pair of fireproof shutters movable toward each other, and the release unit and the gas spring are provided in pairs to correspond to each of the pair of fireproof shutters.

5. The fireproof door apparatus of claim 4, wherein a vertical transfer device is disposed through the passage, is disposed between the pair of the fireproof shutters, and has a hollow formed in a vertical longitudinal direction, and a pair of internal shutters opening and closing the hollow of the vertical transfer device are installed in portions of the pair of fireproof shutters facing each other.

6. The fireproof door apparatus of claim 5, wherein the vertical transfer device is a conveyor device having a conveyor frame disposed in a vertical direction, wherein the conveyor frame is disposed around the hollow and has a side hole communicating with the hollow, each of the pair of internal shutters includes:

a shutter body installed in a side groove of the fireproof shutter and movable to the hollow through the side hole; and a blocking plate installed to reciprocate on the shutter body, and wherein, when the shutter bodies of the pair of internal shutters facing each other move to a portion of the hollow, the blocking plates of the pair of internal shutters facing each other are pushed and moved by each other to close the remaining portion of the hollow.

7. The fireproof door apparatus of claim 6, wherein each of the pair of internal shutters further includes an elastic member installed in the shutter body and connected to the blocking plate so that the blocking plate is returned to its original position in the shutter body after moving to close the remaining portion of the hollow.

8. The fireproof door apparatus of claim 6, wherein each of the pair of internal shutters includes:

a moving block connected to the blocking plate; and an LM guide installed on the shutter body in a moving direction of the blocking plate to guide movement of the blocking plate and having the moving block installed thereon.

9. The fireproof door apparatus of claim 8, wherein each of the pair of internal shutters further includes a stopper installed in the shutter body and limiting movement of the blocking plate so that the moving block does not fall out of the LM guide.

10. A fireproof structure comprising:

a plurality of stories, each having a space formed therein;

a passage connecting a plurality of spaces of the plurality of stories; and a fireproof door apparatus closing the passage in the event of a fire, wherein the fireproof door apparatus includes:

a fireproof shutter opening and closing the passage;

a release unit installed on one side of the passage and in the fireproof shutter and fixing the fireproof shutter in an open state using magnetic force or releasing the fireproof shutter that is fixed; and a gas spring connected to the fireproof shutter and moving the fireproof shutter toward the passage by heat of the fire to close the passage.

11. The fireproof structure of claim 10, wherein the gas spring includes:

a cylinder installed in a passage frame formed at an edge of the passage and filled with gas; and a piston including a piston head built into the cylinder and a piston rod extending from the piston head toward the passage and connected to the fireproof shutter, wherein the gas in the cylinder expands due to heat of the fire and pushes the piston head to move the piston rod toward the passage.

12. The fireproof structure of claim 11, wherein a guide wheel is installed on one edge of the fireproof shutter, and a guide rail configured to allow the guide wheel to roll therealong is installed at one edge of the passage frame.

13. The fireproof structure of claim 10, wherein the passage is opened and closed by a pair of fireproof shutters movable toward each other, and the release unit and the gas spring are provided in pairs to correspond to each of the pair of fireproof shutters.

14. The fireproof structure of claim 13, wherein a vertical transfer device is disposed through the passage, is disposed between the pair of the fireproof shutters, and has a hollow formed in a vertical direction, and a pair of internal shutters opening and closing the hollow of the vertical transfer device are installed in portions of the pair of fireproof shutters facing each other.

15. The fireproof structure of claim 14, wherein the vertical transfer device is a conveyor device having a conveyor frame disposed in a vertical direction, wherein the conveyor frame is disposed around the hollow and has a side hole communicating with the hollow, each of the pair of internal shutters includes:

a shutter body movable to the hollow through the side hole; and a blocking plate installed to reciprocate on the shutter body, and wherein, when the shutter bodies of the pair of internal shutters facing each other move to a portion of the hollow, the blocking plates of the pair of internal shutters facing each other are pushed and moved by each other to close the remaining portion of the hollow.

16. The fireproof structure of claim 15, wherein each of the pair of internal shutters further includes an elastic member installed in the shutter body and connected to the blocking plate so that the blocking plate is returned to its original position after moving to close the remaining portion of the hollow.

17. The fireproof structure of claim 15, wherein each of the pair of internal shutters includes:

a moving block connected to the blocking plate; and an LM guide installed on the shutter body in a moving direction of the blocking plate to guide movement of the blocking plate and having the moving block installed thereon.

18. The fireproof structure of claim 17, wherein each of the pair of internal shutters further includes a stopper installed in the shutter body and limiting movement of the blocking plate so that the moving block does not fall out of the LM guide.

19. A substrate treating facility comprising:

a fireproof structure including a fireproof door apparatus opening and closing a passage of a plurality of stories; and a vertical transfer device disposed to penetrate through the passage, wherein the fireproof structure includes:

the plurality of stories each having a space inside which a substrate treating apparatus is installed;

the passage connecting a plurality of spaces of the plurality of stories; and the fireproof door apparatus closing the passage in the event of a fire, wherein the fireproof door apparatus includes:

a fireproof shutter opening and closing the passage;

a release unit installed on one side of the passage and in the fireproof shutter and fixing the fireproof shutter in an open state using magnetic force or releasing the fireproof shutter that is fixed; and a gas spring connected to the fireproof shutter and moving the fireproof shutter toward the passage by heat of the fire to close the passage.

20. The substrate treating facility of claim 19, wherein the gas spring includes:

a cylinder installed in a passage frame formed at an edge of the passage and filled with gas; and a piston including a piston head built into the cylinder and a piston rod extending from the piston head toward the passage and connected to the fireproof shutter, wherein the gas in the cylinder expands due to heat of the fire and pushes the piston head to move the piston rod toward the passage.

* * * * *